US009331642B2

(12) United States Patent
Musa et al.

(10) Patent No.: US 9,331,642 B2
(45) Date of Patent: May 3, 2016

(54) MONOLITHIC TRANSISTOR CIRCUITS WITH TAPERED FEEDBACK RESISTORS, RF AMPLIFIER DEVICES, AND METHODS OF MANUFACTURE THEREOF

(71) Applicants: Sarmad K. Musa, Gilbert, AZ (US); Seungkee Min, Chandler, AZ (US); Margaret A. Szymanowski, Chandler, AZ (US)

(72) Inventors: Sarmad K. Musa, Gilbert, AZ (US); Seungkee Min, Chandler, AZ (US); Margaret A. Szymanowski, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/318,036

(22) Filed: Jun. 27, 2014

(65) Prior Publication Data
US 2015/0381122 A1 Dec. 31, 2015

(51) Int. Cl.
*H03F 3/19* (2006.01)
*H01L 49/02* (2006.01)
(52) U.S. Cl.
CPC ........ *H03F 3/19* (2013.01); *H01L 28/20* (2013.01); *H03F 2200/144* (2013.01); *H03F 2200/255* (2013.01); *H03F 2200/451* (2013.01)
(58) Field of Classification Search
CPC .............. H01L 28/20; H03F 2200/144; H03F 2200/255; H03F 2200/451
See application file for complete search history.

(56) References Cited

U.S. PATENT DOCUMENTS

| 4,097,988 | A |   | 7/1978  | Hauschild |
|-----------|---|---|---------|-----------|
| 4,118,112 | A |   | 10/1978 | Thornburg |
| 4,126,824 | A |   | 11/1978 | Thornburg et al. |
| 5,889,308 | A | * | 3/1999  | Hong et al. ............... 257/355 |
| 7,374,274 | B2|   | 5/2008  | Cornell |
| 2008/0087963 | A1 |   | 4/2008 | Calafut et al. |
| 2010/0156588 | A1| * | 6/2010 | Privitera ..................... 338/7 |
| 2013/0229237 | A1| * | 9/2013 | Takenaka ................. 330/311 |

FOREIGN PATENT DOCUMENTS

GB      1278442      11/1972

* cited by examiner

*Primary Examiner* — Mamadou Diallo
(74) *Attorney, Agent, or Firm* — Sherry W. Schumm

(57) ABSTRACT

Embodiments of an integrated resistor may be incorporated into monolithic transistor circuits and packaged RF amplifier devices. An embodiment of an integrated resistor includes a semiconductor substrate and a resistor formed over the top surface of the semiconductor substrate from resistive material. The resistor includes at least first and second resistive sections. The first resistive section is tapered so that the first resistive section widens toward an input end of the resistor. The second resistive section is coupled in series with the first resistive section. According to a further embodiment, the second resistive section also is tapered so that the second resistive section widens toward an output end of the resistor. According to another further embodiment, a third resistive section with one or more meanders is coupled in series between the first and second resistive sections.

29 Claims, 7 Drawing Sheets

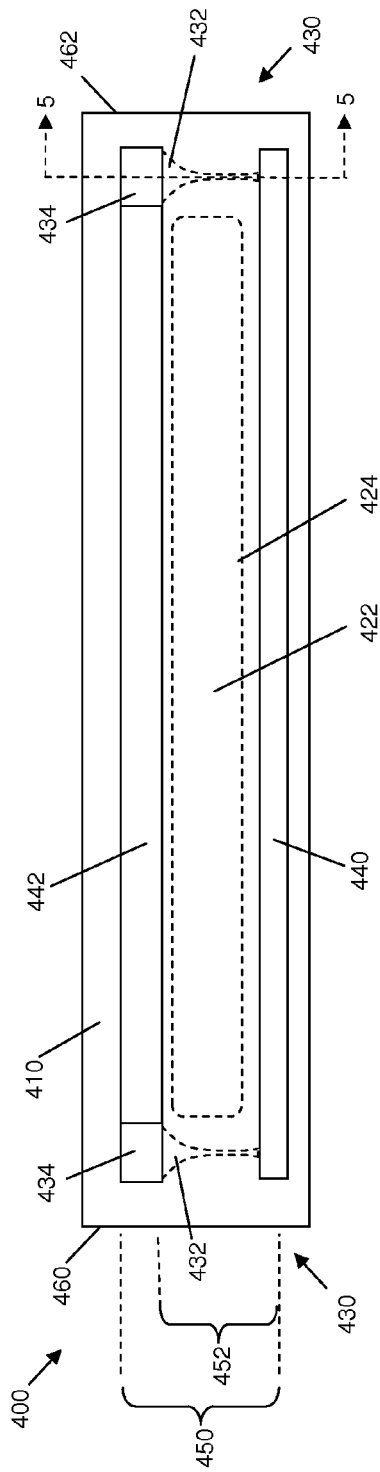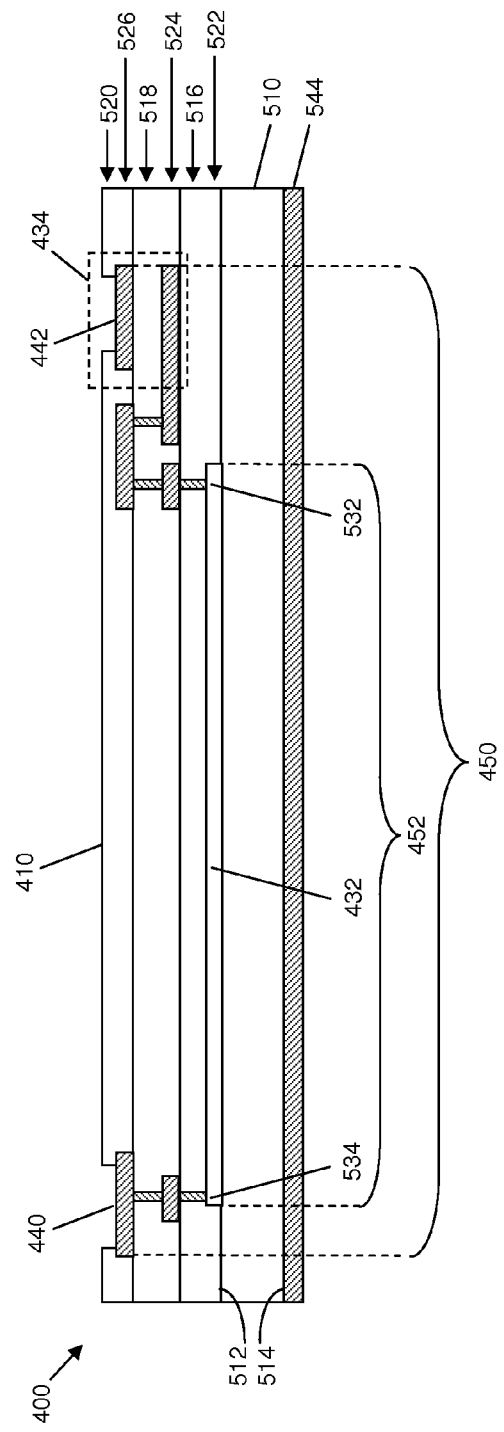
FIG. 4
FIG. 5

MONOLITHIC TRANSISTOR CIRCUITS WITH TAPERED FEEDBACK RESISTORS, RF AMPLIFIER DEVICES, AND METHODS OF MANUFACTURE THEREOF

TECHNICAL FIELD

Embodiments of the subject matter described herein relate generally to packaged semiconductor devices, and more particularly to packaged, radio frequency (RF) semiconductor devices that include transistors with feedback circuits.

BACKGROUND

A typical high power, radio frequency (RF) field effect transistor (FET) for use in an RF amplifier may include a feedback resistor between a current conducting terminal of the FET (e.g., the source or drain) and the gate of the FET. The primary purpose of the feedback resistor is to improve the stability of the FET during operation.

In some cases, the FET and the feedback resistor may form portions of a monolithic integrated circuit (IC) (i.e., the FET and the feedback resistor are formed in and over a single semiconductor substrate). In such a configuration, during operations, heat generated by the FET may be absorbed by the feedback resistor, given the resistor's proximity to the FET. In addition, current through the feedback resistor causes the resistor to heat up. This self-heating due to current flow increases as operational frequencies increase. Conventional feedback transistor designs may be unsuitable for use at very high frequencies, because the maximum allowed temperature limits for such conventional feedback transistors may be exceeded at those very high frequencies.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 4 is a top view of a monolithic transistor circuit suitable for use in a packaged RF amplifier device, in accordance with an example embodiment;

FIG. 5 is a cross-sectional, side view of the monolithic transistor circuit of FIG. 4 along line 5-5;

DETAILED DESCRIPTION

Embodiments of the inventive subject matter include feedback resistors, monolithic integrated circuits (ICs) that include feedback resistors, RF amplifiers that include such monolithic ICs, and packaged semiconductor devices (e.g., packaged radio frequency (RF) amplifier devices) that embody such RF amplifiers. As will be explained in more detail below, the feedback resistor embodiments are capable of operating at higher frequencies than may be achieved using conventional feedback resistors. More particularly, the geometries of the feedback resistor embodiments are configured to reduce the peak current densities experienced by the feedback resistor embodiments, when compared with the peak current densities that may be experienced by conventional feedback resistors given the same operational conditions. With the reduced peak current densities, the feedback resistor embodiments experience reduced self-heating, when compared with the self-heating experienced by conventional feedback resistors. Accordingly, the feedback resistor embodiments may be implemented with RF transistors and systems that operate at higher frequencies than RF transistors and systems that include conventional feedback resistors.

As will be discussed in detail later, particularly in conjunction with FIGS. 6 and 7, embodiments of a feedback resistor include one or more tapers between input and output ends of the resistor. The tapered shape of the feedback resistor enables the resistor to provide a desired effective feedback resistance while reducing the peak current densities and temperatures experienced by the resistor.

Figure 1:
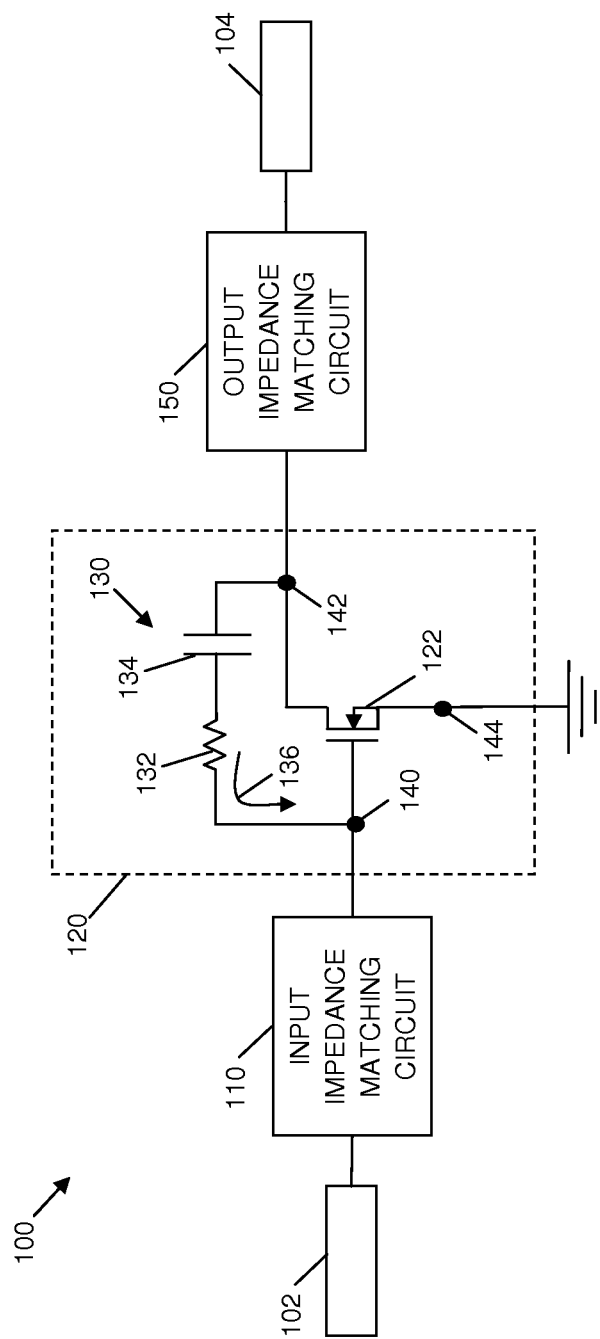
FIG. 1 is a schematic diagram of an RF amplifier with a monolithic transistor circuit that includes a feedback resistor, in accordance with an example embodiment.

FIG. 1 is a schematic diagram of an RF amplifier device 100. Device 100 includes an input lead 102, an input impedance matching circuit 110, a monolithic transistor circuit 120 (including transistor 122 and feedback circuit 130), an output impedance matching circuit 150, and an output lead 104, in an embodiment. Although transistor 122, feedback circuit 130, and input and output impedance matching circuits 110, 150 are shown in the singular in FIG. 1, the depiction is for the purpose of ease of explanation only. Those of skill in the art would understand, based on the description herein, that an RF amplifier device may include multiple instantiations of transistor 122, feedback circuit 130, and/or the input and output impedance matching circuits 110, 150, and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 122, feedback circuit 130, and input and output impedance matching circuits 110, 150, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package.

Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 102 and the control terminal (e.g., gate) of the transistor 122. For example, and according to an embodiment, input impedance matching circuit 110 includes two inductive elements (e.g., two sets of bondwires 212, 216, FIG. 2) and a shunt capacitor (e.g., shunt capacitor 214, FIG. 2). A first inductive element (e.g., a first set of bondwires 212, FIG. 2) is coupled between input lead 102 and a first terminal of the shunt capacitor, and a second inductive element (e.g., a second set of bondwires 216, FIG. 2) is coupled between the first terminal of the shunt capacitor and the control terminal of transistor 122. The second terminal of the shunt capacitor is coupled to ground (or another voltage reference). The combination of the inductive elements and the shunt capacitor functions as a low-pass filter.

Monolithic transistor circuit 120, including transistor 122 and feedback circuit 130, is also located within the device's interior. According to an embodiment, transistor 122 is the primary active component of device 100. Transistor 122 includes a control terminal and two current conducting terminals, where the current conducting terminals are spatially and electrically separated by a variable-conductivity channel. For example, transistor 122 may be a field effect transistor (FET) (such as a metal oxide semiconductor FET (MOSFET)), which includes a gate (control terminal), a drain (a first current conducting terminal), and a source (a second current conducting terminal). Alternatively, transistor 122 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 122 is coupled to the input impedance matching circuit 110, the drain of transistor 122 is coupled to the output impedance matching circuit 150, and the source of transistor 122 is coupled to a voltage reference node 144 (e.g., ground or another voltage reference). Through the variation of control signals provided to the gate of transistor 122, the current between the current conducting terminals of transistor 122 may be modulated.

Feedback circuit 130 is coupled between nodes 142 and 140, or between a current conducting terminal (e.g., the drain) of transistor 122 and the control terminal (e.g., the gate) of transistor 122. According to an embodiment, feedback circuit 130 and transistor 122 form portions of a monolithic IC, as mentioned previously. Feedback circuit 130 includes a feedback capacitor 134 and a feedback resistor 132, coupled in series between nodes 142 and 140. More specifically, feedback capacitor 134 has a first terminal connected to node 142, and a second terminal connected to a first terminal of feedback resistor 132. Feedback resistor 132 also includes a second terminal connected to node 140. During operation, the direction of current flow through feedback circuit 130 is from node 142 toward node 140, as indicated by arrow 136.

Although only one feedback circuit 130 is shown to be coupled between nodes 142 and 140 in FIG. 1, other embodiments may include multiple feedback circuits 130 coupled in parallel between nodes 142 and 140. In addition, in an alternate embodiment, the order in the series circuit of the feedback capacitor 134 and the feedback resistor 132 may be opposite that shown in FIG. 1 (e.g., the feedback capacitor 134 may be connected to node 140, and the feedback resistor 132 may be connected to node 142).

Output impedance matching circuit 150 is configured to match the output impedance of device 100 with the input impedance of an external circuit or component (not shown) that may be coupled to output lead 104. Output impedance matching circuit 150 is coupled between the first current conducting terminal (e.g., the drain) of transistor 122 and the output lead 104. According to an embodiment, output impedance matching circuit 150 includes three inductive elements (e.g., three sets of bondwires 232, 234, 240, FIG. 2) and two capacitors (e.g., capacitors 242, 246, FIG. 2). A first inductive element (e.g., a third set of bondwires 232, FIG. 2), which may be referred to herein as a "series inductor," is coupled between the first current conducting terminal (e.g., drain) of transistor 122 and the output lead 104. A second inductive element (e.g., a fourth set of bondwires 234, FIG. 2), which may be referred to herein as a "shunt inductor," is coupled between the first current conducting terminal of transistor 122 and a first terminal of a first capacitor (e.g., capacitor 242, FIG. 2), which may be referred to herein as a "shunt capacitor." Finally, a third inductive element (e.g., a fifth set of bondwires 240, FIG. 2), which may be referred to herein as a "low-pass matching inductor," is coupled between the output lead 104 and a first terminal of a second capacitor (e.g., capacitor 246, FIG. 2), which may be referred to herein as a "low-pass matching capacitor." Second terminals of the shunt and low-pass matching capacitors coupled to ground (or to another voltage reference), in an embodiment.

The shunt inductor and the shunt capacitor are coupled in series between a current conducting terminal of transistor 122 and ground, and this combination of impedance matching elements functions as a first (high-pass) matching stage. The low-pass matching inductor and the low-pass matching capacitor are coupled in series between the output lead 104 and ground (or another voltage reference), and this combination of impedance matching elements functions as a second (low-pass) matching stage. According to an alternate embodiment, the low pass matching stage may be excluded altogether from device 100.

Figure 2:
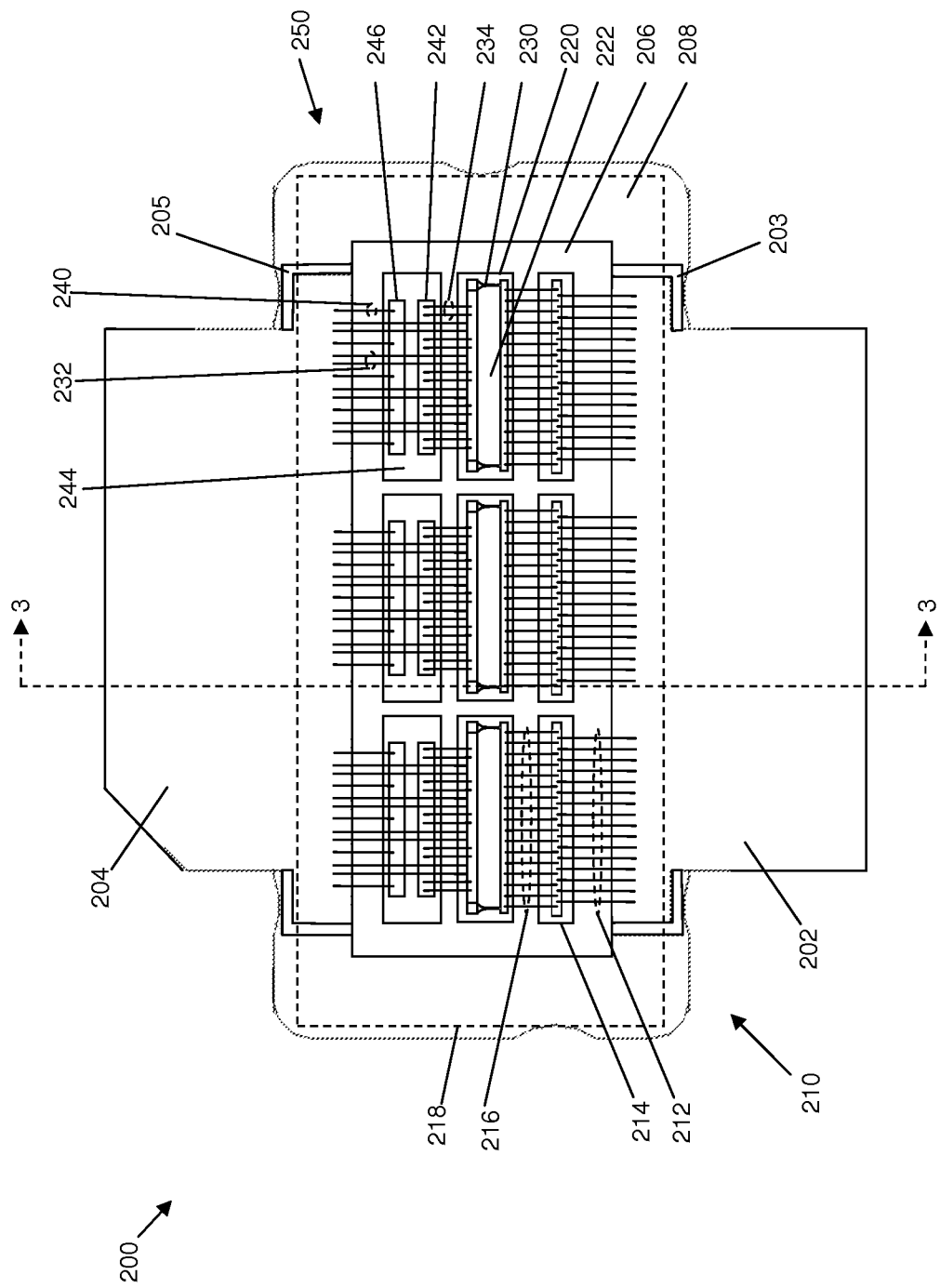
FIG. 2 is a top view of an example of a packaged RF amplifier device that embodies the RF amplifier circuit of FIG. 1, in accordance with an example embodiment.
Figure 3:
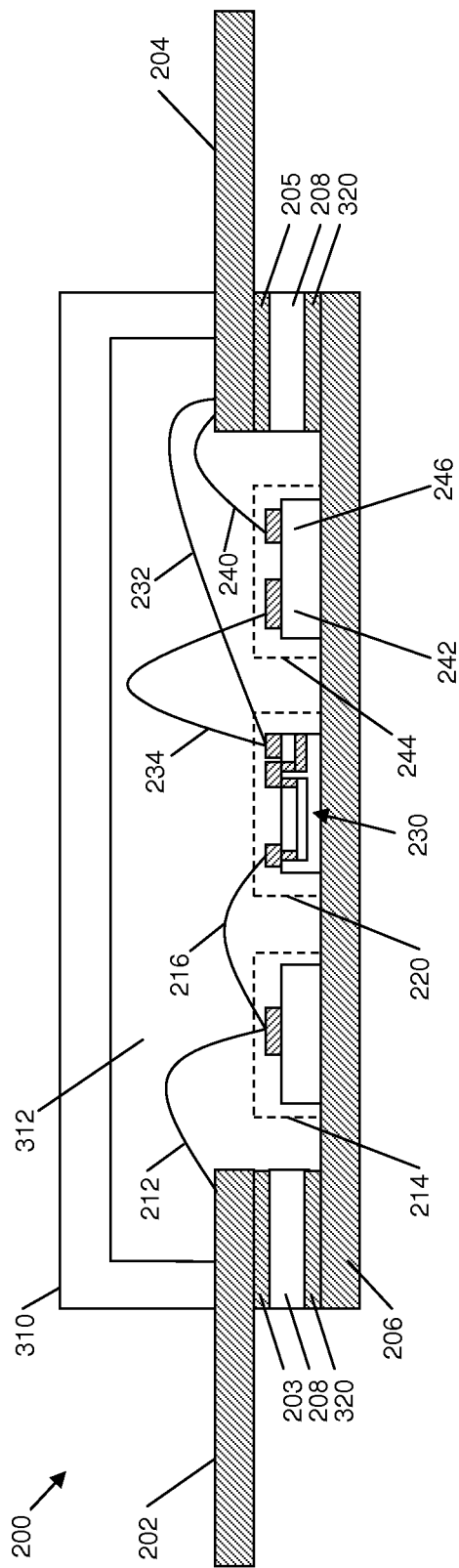
FIG. 3 is a cross-sectional, side view of the RF amplifier device of FIG. 2 along line 3-3.

FIG. 2 is a top view of an example of a packaged RF amplifier device 200 that embodies multiple instances of the circuit of FIG. 1, and that includes a plurality of monolithic transistor circuits 220, each with a transistor 222 and one or more feedback circuits 230, in accordance with an example embodiment. For enhanced understanding, FIG. 2 should be viewed in conjunction with FIG. 3, which is a cross-sectional, side view of the semiconductor device 200 of FIG. 2 along line 3-3. More specifically, FIG. 3 is a cross-sectional view through input and output leads 202, 204 and the active device area. FIG. 3 also illustrates a cap 310, which may be implemented in air cavity package embodiments to seal the interior components of device 200 within an air cavity 312.

Device 200 includes an input lead 202 (e.g., input lead 102, FIG. 1), an output lead 204 (e.g., output lead 104, FIG. 1), a flange 206, an isolation structure 208, a plurality of monolithic transistor circuits 220 (e.g., transistor circuit 120, FIG. 1), a plurality of input impedance matching circuits 210 (e.g., input impedance matching circuit 110, FIG. 1), and a plurality of output impedance matching circuits 250 (e.g., output impedance matching circuit 150, FIG. 1), all of which may be packaged together as parts of the device. In the example of FIG. 2, device 200 includes three input impedance matching circuits 210, three transistor circuits 220, and three output impedance matching circuits 250 that essentially function in parallel (e.g., each of three signal paths between input lead 202 and output lead 204 includes a series-coupled combination of an input impedance matching circuit 210, a transistor circuit 220, and an output impedance matching circuit 250). In other embodiments, a device may include one, two, or more than three signal paths.

According to an embodiment, device 200 is housed in an air cavity package, in which input and output impedance matching circuits 210, 250 and transistor circuits 220 are located within an enclosed air cavity 312. Basically, the air cavity is bounded by flange 206, isolation structure 208, and a cap 310 overlying and in contact with the isolation structure 208 and leads 202, 204. In FIG. 2, an example perimeter of the cap 310 is indicated by dashed box 218. In other embodiments, a device may be housed in an overmolded package (i.e., a package in which the electrical components within the active device area are encapsulated with a non-conductive molding compound, and in which portions of the leads 202, 204, and all or portions of the isolation structure 208 also may be encompassed by the molding compound).

Flange 206 includes a rigid electrically-conductive substrate, which has a thickness that is sufficient to provide structural support for electrical components and elements of device 200. In addition, flange 206 may function as a heat sink for transistor circuits 220 and other devices mounted on flange 206. Flange 206 has a top and bottom surface (only a central portion of the top surface is visible in FIG. 2), and a substantially-rectangular perimeter that corresponds to the perimeter of the device 200 (e.g., to the perimeter of isolation structure 208, described below).

Flange 206 is formed from a conductive material, and may be used to provide a ground reference for the device 200. For example, various components and elements may have terminals that are electrically coupled to flange 206, and flange 206 may be electrically coupled to a system ground when the device 200 is incorporated into a larger electrical system. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. Flange 206 may more generally be referred to as a substrate with a conductive surface.

Isolation structure 208 is attached to the top surface of flange 206. For example, isolation structure 208 may include a layer of metallization 320 on its bottom surface, which may be soldered to or otherwise attached to the top surface of flange 206. Isolation structure 208 is formed from a rigid, electrically insulating material (i.e., a material with a dielectric constant in a range from about 2.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 202, 204 and flange 206). For example, isolation structure 208 may be formed from inorganic materials (e.g., ceramic such as aluminum oxide, aluminum nitride, and so on) and/or organic materials (e.g., one or more polymers or printed circuit board (PCB) materials). In an embodiment in which isolation structure 208 comprises PCB materials (e.g., the isolation structure 208 essentially includes a single or multi-layer PCB), conductive layers 203, 320 (e.g., copper layers) may be included on the top and bottom surfaces of the isolation structure. In a further embodiment, a conductive layer on the top surface of the isolation structure 208 may be patterned and etched to form a leadframe (including leads 202, 204) for the device 200, and a conductive layer 320 on the bottom surface of the isolation structure 208 may be coupled to the flange 206. In other embodiments, conductive layers may be excluded from the top and/or bottom surface of the isolation structure 208. In such embodiments, leads (e.g., leads 202, 204) may be coupled to the isolation structure 208 using epoxy (or other adhesive materials), and/or the isolation structure 208 may be coupled to the flange 206 using epoxy (or other adhesive materials). In still other embodiments, the isolation structure 208 may be milled at the portion of its top surface to which a lead is attached.

Isolation structure 208 has a frame shape, in an embodiment, which includes a substantially enclosed, four-sided structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. For example, in an alternate embodiment, isolation structure 208 may include multiple portions that contact each other or that are spatially separated from each other (e.g., isolation structure 208 may have one portion isolating input lead 202 from flange 206, and another portion isolating output lead 204 from flange 206). In an embodiment in which isolation structure 208 includes multiple, spatially separated portions, the "central opening" in isolation structure 208 is considered to be the space between the multiple, spatially separated portions. In addition, isolation structure 208 may be formed from a homogenous material, or isolation structure 208 may be formed from multiple layers.

The input and output leads 202, 204 are mounted on a top surface of the isolation structure 208 on opposed sides of the central opening, and thus the input and output leads 202, 204 are elevated above the top surface of the flange 206, and are electrically isolated from the flange 206. For example, the input and output leads 202, 204 may be soldered or otherwise attached to metallization 203, 205 on a top surface of isolation structure 208. The metallization 203, 205 may be considered to be conductive pads to which the input and output leads 202, 204 are coupled. Generally, the input and output leads 202, 204 are oriented in order to allow for attachment of bondwires (e.g., bondwires 212, 232, 240) between the input and output leads 202, 204 and components and elements within the central opening of isolation structure 208.

Transistor circuits 220 and various capacitors 214, 242, 246 of the input and output impedance matching circuits 210, 250 are mounted on a generally central portion of the top surface of a flange 206 that is exposed through the opening in isolation structure 208. According to an embodiment, transistor circuits 220 are positioned within the active device area of device 200, along with impedance matching capacitors 214, 242, 246. According to an embodiment, the capacitors 242, 246 associated with each output impedance matching circuit 250 form portions of a monolithic IC, referred to herein as "capacitor assembly" 244. According to various embodiments, the transistor circuits 220, capacitors 214, and capacitor assemblies 244 (including capacitors 242, 246) may be coupled to flange 206 using conductive epoxy, solder, solder bumps, sintering, and/or eutectic bonds.

Each input impedance matching circuit 210 (e.g., input impedance matching circuit 110, FIG. 1) is coupled between the input lead 202 (e.g., input lead 102, FIG. 1) and a control terminal of a transistor 222 within a transistor circuit 220 (e.g., transistor 122, FIG. 1). In the device 200 of FIG. 2, the input impedance matching circuit 210 includes two inductive elements 212, 216 and a capacitor 214. Each inductive element 212, 216 is formed from a plurality of parallel, closely-spaced sets of bondwires, in an embodiment. For example, a first inductive element 212 includes a plurality of bondwires coupled between input lead 202 and a first terminal of capacitor 214, and a second inductive element 216 includes a plurality of bondwires coupled between the first terminal of capacitor 214 and the control terminal of a transistor 222 of transistor circuit 220. The second terminal of capacitor 214 is coupled to the flange 206 (e.g., to ground). Capacitor 214 may be, for example, a discrete silicon capacitor, a discrete ceramic capacitor, or another type of capacitor. Bondwires 212, 216 are attached to a conductive top plate at the top surface of capacitor 214.

As mentioned previously, each transistor circuit 220 includes a transistor 222 (e.g., transistor 122, FIG. 1) and one or more feedback circuits 230 (e.g., feedback circuit 130, FIG. 1). Each transistor 222, in turn, has a control terminal (e.g., a gate) and two current conducting terminals (e.g., a drain and a source). The control terminal of each transistor 222 is coupled to an input impedance matching circuit 210 (e.g., through bondwires 216 between capacitor 214 and the transistor control terminal). In addition, a current conducting terminal (e.g., the drain) of each transistor 222 is coupled to an output impedance matching circuit 250 (e.g., through bondwires 234 between the transistor current conducting terminal and capacitor 242) and to the output lead 204 (e.g., through bondwires 232 between the transistor current conducting terminal and output lead 204). The other current conducting terminal (e.g., the source) is coupled to the flange 206 (e.g., to ground), in an embodiment.

Each output impedance matching circuit 250 (e.g., output impedance matching circuit 150, FIG. 1) is coupled between the first current conducting terminal (e.g., drain) of the transistor 222 of a transistor circuit 220 (e.g., transistor 122, FIG. 1) and the output lead 204 (e.g., output lead 104, FIG. 1). In the device 200 of FIG. 2, the output impedance matching circuit 250 includes three inductive elements 232, 234, 240 and two capacitors 242, 246. According to an embodiment, the capacitors 242, 246 of each output impedance matching circuit 250 are included in a capacitor assembly 244 (e.g., a monolithic IC), according to an embodiment. In an embodiment in which low-pass matching circuits are excluded, the capacitor assembly 244 may exclude capacitor 246.

Again, each inductive element 232, 234, 240 is formed from a plurality of parallel, closely-spaced sets of bondwires, in an embodiment. For example, a series inductive element 232 includes a plurality of bondwires coupled between the first current conducting terminal (e.g., the drain) of a transistor 222 of a transistor circuit 220 and the output lead 204. A shunt inductive element 234 includes a plurality of bondwires coupled between the first current conducting terminal of the transistor 222 and a first terminal of a shunt capacitor 242. A low-pass matching inductive element 240 is coupled between the output lead 204 and a first terminal of low-pass matching capacitor 246. Second terminals of capacitors 242, 246 are electrically connected to the flange 206 (e.g., to ground). Bondwires corresponding to inductive elements 234, 240 are attached to conductive top plates at the top surfaces of capacitors 242, 246.

Each of the previously-discussed and illustrated embodiments corresponds to a two-lead device (e.g., devices having an input lead 204 and an output lead 206, FIG. 2). Such a device may be incorporated into a larger electrical system by physically coupling the device to a printed circuit board (PCB), electrically connecting the input lead to a signal source, and electrically connecting the output lead to a load. The PCB may further include one or more bias feeds (e.g., each with a length of lambda/4 or some other length) with proximal ends located close to the PCB connection(s) to the output lead and/or input lead. A blocking capacitor at the distal end of each bias lead may provide a short at a given RF frequency, which when transformed through the bias lead, appears as an open circuit.

Other embodiments include devices with bias leads formed as integral portions of the device, and additional conductive features that couple the bias leads with the impedance matching network(s). For example, another embodiment includes a four-lead device, in which two bias leads are coupled to the output impedance matching circuit 250. Another embodiment may include a four-lead device with two bias leads coupled to the input impedance matching circuit 210. Yet another embodiment includes a six-lead device with two bias leads coupled to the output impedance matching circuit 250 and two bias leads coupled to the input impedance matching circuit 210. In still other embodiments, only a single bias lead may be coupled to the input and/or output impedance matching circuits 210, 250 (e.g., particularly for embodiments in which there are more than two RF leads, such as in dual-path and multi-path devices).

As will be explained in more detail in conjunction with FIGS. 4-7, each transistor circuit 220 includes one or more feedback circuits 230, with each feedback circuit 230 including a feedback capacitor (e.g., feedback capacitor 134, FIG. 1) and a feedback resistor (e.g., feedback resistor 132, FIG. 1). More specifically, FIG. 4 is a top view of a monolithic transistor circuit 400 (e.g., transistor circuit 120, 220, FIGS. 1, 2) suitable for use in a packaged RF amplifier device (e.g., device 200, FIG. 2), in accordance with an example embodiment. For increased understanding, FIG. 4 should be viewed in parallel with FIG. 5, which is a cross-sectional, side view of the monolithic transistor circuit 400 of FIG. 4 along line 5-5.

Transistor circuit 400 includes a semiconductor substrate 510, a plurality of conductive, resistive, and insulating layers 516, 518, 520, 522, 524, 526 formed over a top surface 512 of the semiconductor substrate 510, and an additional conductive layer 544 formed on a bottom surface 514 of the semiconductor substrate 510. In the top down view of FIG. 4, portions of conductive layer 526 that are exposed at the top surface 410 of transistor circuit 400 provide conductive contact pads 440, 442, which allow transistor circuit 400 to be electrically connected to external circuit components, as will be described later. When included in a circuit such as circuit 100, FIG. 1, contact pad 440 corresponds to node 140, contact pad 442 corresponds to node 442, and conductive layer 544 corresponds to node 144 (or to the flange 206, FIG. 2). For example, the first conductive pad 440 may be configured as a bond pad, which enables the first conductive pad 440 to be wirebonded to circuitry external to transistor circuit 400 (e.g., first conductive pad 440 may be electrically coupled to input impedance matching circuit 110, 210 through bondwires 216). The second conductive pad 442 also may be configured as a bond pad, which enables the second conductive pad 442 to be wirebonded to other circuitry external to transistor circuit 400 (e.g., second conductive pad 442 may be electrically coupled to output impedance matching circuit 150, 250 and output lead 104, 204 through bondwires 232, 234). The first and second conductive pads 440, 442 are separated by a distance 450.

Semiconductor substrate 510 may, for example, be formed from silicon, gallium arsenide, gallium nitride, or any other suitable semiconductor material. A transistor 422 (e.g., transistor 122, 222, FIGS. 1, 2) is formed in and over a generally central portion 424 of the semiconductor substrate 510. Although the details are not illustrated in FIG. 4 or 5, the transistor 422 includes one or more doped semiconductor regions within substrate 510 corresponding to current carrying regions (e.g., source and drain) and channel regions of the transistor 422, as well as various control terminal constructs (e.g., gate dielectrics and gate conductors) formed over the channel region(s). The control terminal (e.g., the gate) of transistor 422 is electrically coupled to contact pad 440, a first current carrying region (e.g., the drain or source) of transistor 422 is electrically coupled to contact pad 442, and a second current carrying region (e.g., the source or drain) of transistor 422 is electrically coupled to conductive layer 544, in an embodiment.

Transistor circuit 400 also includes at least one feedback circuit 430 (e.g., feedback circuit 130, 230, FIGS. 1, 2), where each feedback circuit 430 is electrically coupled between a current carrying terminal and the control terminal of transistor 422 (or between contact pads 442 and 440), as will be described in more detail below. When multiple feedback circuits 430 are implemented (e.g., as in transistor circuit 400, which includes two feedback circuits 430), the feedback circuits 430 are coupled in parallel with each other between the current carrying terminal and the control terminal of transistor 422 (or between contact pads 442 and 440).

In the illustrated embodiment, transistor circuit 400 includes two feedback circuits 430, each including a series-coupled combination of a feedback capacitor 434 (e.g., feedback capacitor 134, FIG. 1) and a feedback resistor 432 (e.g., feedback resistor 132, FIG. 1). The two circuits are positioned at and electrically connected to opposite ends of contact pads 442, 440 (i.e., proximate the sides 460, 462 of transistor circuit 400 that are parallel to the direction of current flow through device 400), and the two circuits are coupled in parallel between contact pads 442, 440. In other embodiments, the transistor circuit 400 may include only one feedback circuit 430 (e.g., only one series-coupled capacitor 434 and resistor 432) or more than two feedback circuits 430 (e.g., more than two series-coupled capacitors 434 and resistors 432) coupled in parallel with each other. In addition, in alternate embodiments, the feedback circuits 430 may be located in positions other than at ends of the contact pads 440, 442. In still another alternate embodiment, rather than including a single transistor block 422, an alternate embodiment of a monolithic transistor circuit may include multiple transistor die blocks, some of which may have feedback circuits positioned between them.

According to an embodiment, the total capacitance of the feedback capacitor(s) 434 coupled between contact pads 442 and 440 may be in a range of about 1 picofarad (pF) to about 100 pF, although the capacitance value may be lower or higher, in other embodiments. Further, the total resistance value of the feedback resistor(s) 432 coupled between contact pads 442 and 440 may be in a range of about 500 Ohms to about 10,000 Ohms, although the resistance value may be lower or higher, in other embodiments.

In the illustrated embodiment, each feedback capacitor 434 is formed from vertically-aligned portions of first and second conductive layers 524, 526, which are electrically insulated from each other with a portion of an insulating layer 518 located between the first and second conductive layers 524, 526. According to a more specific embodiment, a top electrode (or plate) of the feedback capacitor 434 is formed from a portion of a first conductive layer 526 located proximate to a top surface 410 of the transistor circuit 400. For example, the top electrode may be formed from the same conductive layer 526 as contact pads 442, 440, and the top electrode may be an extension of contact pad 442, in an embodiment. A bottom electrode (or plate) of the feedback capacitor 434 is formed from a portion of a second conductive layer 524 positioned below the top electrode of the feedback capacitor 434. In an alternate embodiment, the feedback capacitor 434 may be formed using portions of other conductive layers. In still other alternate embodiments, the feedback capacitor 434 may have a construct other than the parallel plate construct illustrated in FIG. 5 and described above. For example, the feedback capacitor 434 may be a metal-insulator-metal (MIM) capacitor (i.e., a capacitor formed from parallel metal plates electrically separated by a thin dielectric, such as a thin nitride or oxide), a discrete capacitor coupled to a surface of the transistor circuit 400, or any other type of series capacitor.

According to an embodiment, the bottom electrode of feedback capacitor 434 is electrically coupled (e.g., through a series of conductive vias and portions of conductive layers 524, 526, as illustrated) to a first terminal or end 532 (referred to below as an "input end") of feedback resistor 432. A second terminal or end 534 of feedback resistor 432 (referred to below as an "output end") is electrically coupled (e.g., through a series of conductive vias and portions of conductive layers 524, 526, as illustrated) to contact pad 440. A distance 452 between the input and output ends 532, 534 is less than or equal to the distance 450 between contact pads 442, 440, according to an embodiment.

According to an embodiment, each feedback resistor 432 is formed from a portion of a layer of resistive material 522 located over the top surface 512 of the semiconductor substrate 510. For example, the layer of resistive material 522 may include tungsten silicide, polysilicon, or any other sufficiently resistive material. According to an embodiment, the resistive material from which layer 522 is formed has a thickness in a range of about 0.05 microns to about 1.0 microns, and a sheet resistivity in a range of about 1.0 to about 100 Ohms per square. Desirably, other portions of the layer of resistive material 522 form portions of the transistor 422, as well. Further, in other embodiments, each feedback resistor 432 may be formed from multiple portions of one or more layers of resistive material (e.g., from different portions of the same layer of resistive material or from portions of different layers of resistive material), where the multiple portions may be electrically coupled through one or more intervening conductive structures (e.g., vias and/or traces).

As will be described in more detail in conjunction with FIGS. 6 and 7, each feedback resistor 432 includes multiple resistive sections, each having a distinctive shape. For example, according to an embodiment, a first section of the resistor 432 corresponding to the input end 532 (e.g., sections 610, 710, FIGS. 6, 7) is physically configured to have a significantly higher current carrying capacity than a second section of the resistor 432 corresponding to the output end 534 (e.g., sections 640, 770, FIGS. 6, 7). In addition, each feedback resistor 432 may include a third section (e.g., section 740, FIG. 7) between the first and second sections, where the third section includes one or more meandering resistive structures that enable the path length and total resistance of the feedback resistor 432 to be increased without increasing the distance 452 between the input and output ends 532, 534.

Although transistor circuit 400 is shown to include one resistive material layer 522, two conductive layers 524, 526, and three insulating layers 516, 518, 520, those of skill in the art would understand, based on the description herein, that a transistor circuit may include more of each type of layer than is depicted in FIG. 4. Further, capacitor 434 may be formed using conductive layers other than those depicted in FIG. 4, and/or resistor 432 may be formed in a resistive layer other than that depicted in FIG. 4. In addition, the electrical interconnections between capacitor 434, resistor 432, and conductive pad 440 may be configured differently from those depicted in FIG. 4 (e.g., different conductive vias and/or portions of conductive layers may be used to provide the electrical interconnections). Further, those of skill in the art would understand, based on the description herein, that transistor circuit 400 also may be used in devices that are different from the packaged RF amplifier device of FIG. 2. More specifically, various embodiments of transistor circuit 400 may be used in any of a variety of systems that include a transistor with a feedback circuit that includes a feedback resistor.

Figure 6:
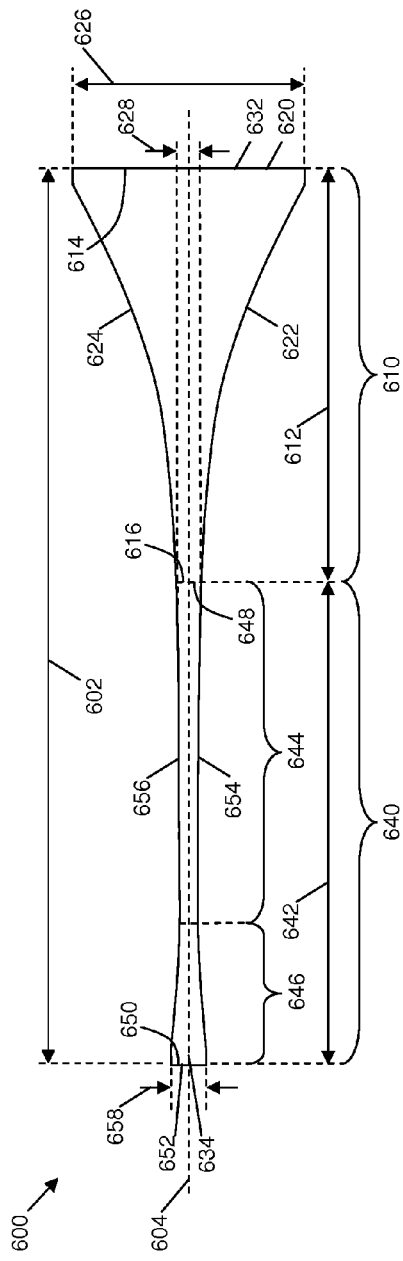
FIG. 6 is a top view of a multi-section resistor suitable for use in the monolithic transistor circuit of FIG. 4, in accordance with an example embodiment.

FIG. 6 is a top view of a multi-section resistor 600 (e.g., feedback resistor 132, 432, FIGS. 1, 4) suitable for use in a monolithic transistor circuit (e.g., transistor circuits 120, 220, 400), in accordance with an example embodiment. Resistor 600 is formed from a single layer of resistive material (e.g., layer 522, FIG. 5), in an embodiment, and includes an input end 632, an output end 634, and multiple resistive sections 610, 640 between the input and output ends 632, 634. A total length 602 of the multi-section resistor 600 between the input and output ends 632, 634 along a primary axis 604 of the resistor 600 is in a range of about 100 microns to about 1500 microns, in an embodiment, although the total length 602 may be shorter or longer, as well.

According to an embodiment, the multiple resistive sections 610, 640 are integrally formed and connected with each other (e.g., first resistive section 610 is directly connected to second resistive section 640). When integrated into a transistor circuit (e.g., transistor circuits 120, 220, 400), the input end 632 would be electrically coupled (e.g., through vias, conductive traces, and a series feedback capacitor 134, 434) to a current carrying terminal of the transistor (e.g., to node 142 or contact pad 442, corresponding to the source or drain of transistor 122, 422), and the output end 634 would be electrically coupled (e.g., through vias and conductive traces) to a control terminal of the transistor (e.g., to node 140 or contact pad 440, corresponding to the gate of transistor 122, 422). In other embodiments, the resistive sections 610, 640 (or portions thereof) may be formed using portions of different resistive material layers, and/or the resistive sections 610, 640 may be connected together with intervening conductive structures (e.g., conductive vias and/or traces).

According to an embodiment, the first resistive section 610 and the second resistive section 640 have lengths 612, 642 that are substantially parallel and co-linear with the primary axis 604 of the resistor 600, where the primary axis 604 may be defined as an axis that extends between the first and second ends 632, 634. Accordingly, the resistive material forming the first and second resistive sections 610, 640 is continuous along the entire primary axis 604. In an alternate embodiment, either or both of the resistive sections 610, 640 (or portions thereof) may have lengths that are offset from or not parallel with the primary axis 604.

The length 612 of the first resistive section 610 between first and second ends 614, 616 of the first resistive section 610 is in a range of about 50 microns to about 750 microns, in an embodiment, although the length 612 may be shorter or longer, as well. Similarly, the length 642 of the second resistive section 640 between first and second ends 644, 646 of the second resistive section 640 is in a range of about 50 microns to about 750 microns, in an embodiment, although the length 642 may be shorter or longer, as well.

The general shape of the first resistive section 610 (as viewed from the top) is defined by an edge 620 of the first resistive section 610 (coincident with the input end 632 of the resistor 600), and sides 622, 624 of the first resistive section 610, where the sides 622, 624 extend between the first and second ends 614, 616 of the first resistive section 610.

According to an embodiment, the first end 614 of the first resistive section 610 has a first width 626, and the second end 616 of the first resistive section 610 has a second width 628 that is substantially narrower than the first width 626. For example, the second width 628 may be in a range of about 5 percent to about 60 percent of the first width 626, in an embodiment. In an alternate embodiment, the second width 628 may be in a range of about 2 percent to about 80 percent of the first width 626. According to another embodiment, the first width 626 is at least 200 percent greater than the second width 628. According to another embodiment, the first width 626 may be in a range of about 10 to about 500 microns, and the second width 628 may be in a range of about 2 to about 400 microns, in an embodiment. In alternate embodiments, the first and second widths 626, 628 may be shorter or wider than the above-given ranges.

According to an embodiment, the distance (measured in a direction perpendicular to the primary axis 604) between the sides 622, 624 of the first resistive section 610 narrows smoothly along arcs between the first width 626 and the second width 628, as shown in FIG. 6. In alternate embodiment, the distance between the sides 622, 624 may narrow linearly (i.e., the sides 622, 624 may be straight), or the distance between the sides 622, 624 may narrow in increments (e.g., the sides 622, 624 may have a stair-step shape). In still another alternate embodiment, one of the sides (e.g., side 622) may be substantially straight and parallel with the primary axis 604, while the other side (e.g., side 624) has an arc or other shape that is not parallel with the primary axis 604 (i.e., the narrowing of the distance between the sides 622, 624 may be due to the shape and orientation of the side that is not parallel with the primary axis 604).

The second resistive section 640 also has a first end 648 and a second end 650. The general shape of the second resistive section 640 (as viewed from the top) is defined by an edge 652 of the second resistive section 640 (coincident with the output end 634 of the resistor 600), and sides 654, 656 of the second resistive section 640, where the sides 654, 656 extend between the first and second ends 648, 650 of the second resistive section 640.

According to an embodiment, the second resistive section 640 includes two sub-sections 644, 646. Along the first sub-section 644, the sides 654, 656 of the second resistive section 640 are substantially parallel to each other. Conversely, the second sub-section 646 has a tapered shape, similar to the tapered shape of the first resistive section 610, although the tapered shape of the second resistive section 640 may or may not be as extreme as the tapered shape of the first resistive section 610. More particularly, according to an embodiment, the first end 648 of the second resistive section 640 has the second width 628, and the second end 650 of the second resistive section 640 has a third width 658 that is wider than the second width 628. According to an embodiment, the third width 658 may be in a range of about 105 percent to about 200 percent of the second width 628, in an embodiment. According to another embodiment, the third width 658 may be in a range of about 200 percent to about 1000 percent of the second width 628. For example, the third width 658 may be at least 5 percent greater than the second width 628, in an embodiment. As another example, the third width 658 may be at least 20 percent greater than the second width 628. For example, the second width 628 may be in a range of about 2 to about 400 microns, and the third width 658 may be in a range of about 2.1 to about 500 microns, in an embodiment. In alternate embodiments, the second and third widths 628, 658 may be shorter or wider than the above-given ranges. Further, in yet another alternate embodiment, the second resistive section 640 may have a substantially straight shape (i.e., not tapered), so that the second width 628 and the third width 658 are substantially equal.

According to an embodiment, the distance (measured in a direction perpendicular to the primary axis 604) between the sides 654, 656 of the second sub-section 646 of the second resistive section 640 widens smoothly along arcs between the second width 628 and the third width 658, as shown in FIG. 6. In alternate embodiment, the distance between the sides 654, 656 may widen linearly (i.e., the sides 654, 656 may be straight), or the distance between the sides 654, 656 may widen in increments (e.g., the sides 654, 656 may have a stair-step shape). In still another alternate embodiment, one of the sides (e.g., side 654) may be substantially straight and parallel with the primary axis 604, while the other side (e.g., side 656) has an arc or other shape that is not parallel with the primary axis 604 (i.e., the widening of the distance between the sides 654, 656 may be due to the shape and orientation of the side that is not parallel with the primary axis 604).

Although FIG. 6 depicts a "double-tapered" embodiment, an alternate embodiment may exclude the taper proximate to the output end 634 of resistor 600. In other words, a "single-tapered" alternate embodiment of resistor 600 may include a second resistive section 640 defined by sides 654, 656 that are substantially parallel to each other along an entire length 642 of the second resistive section 640. In addition, although particular tapered shapes are depicted in FIG. 6, alternate embodiments may include tapers that are more or less extreme than those depicted in FIG. 6.

Figure 7:
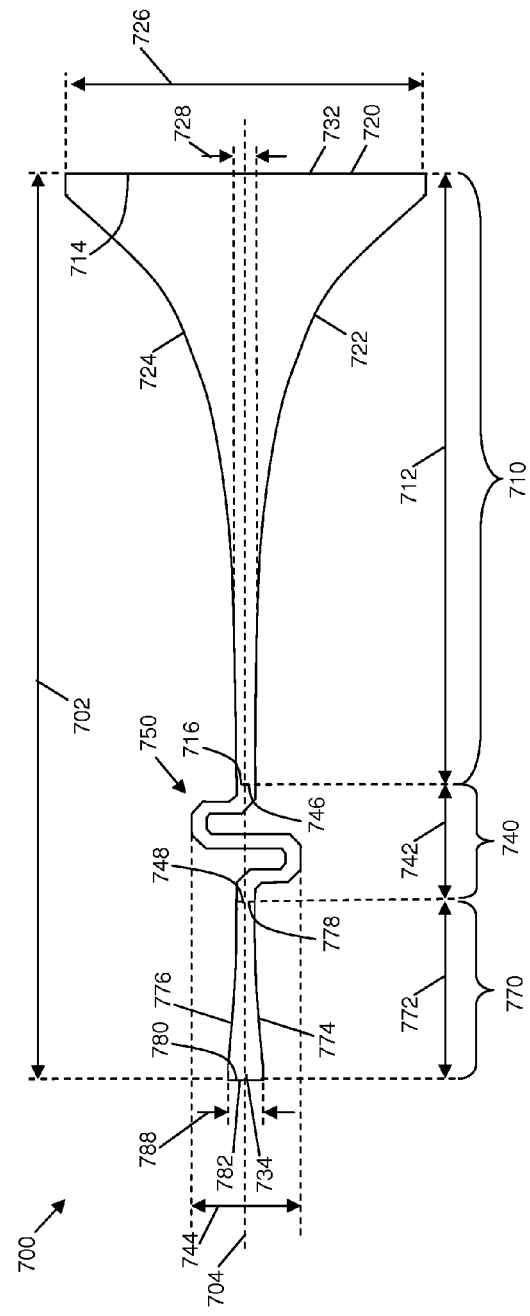
FIG. 7 is a top view of a multi-section resistor suitable for use in the monolithic transistor circuit of FIG. 4, in accordance with another example embodiment.

FIG. 7 is a top view of a multi-section resistor 700 (e.g., feedback resistor 132, 432, FIGS. 1, 4) suitable for use in a monolithic transistor circuit (e.g., transistor circuits 120, 220, 400), in accordance with another example embodiment. Resistor 700 is formed from a single layer of resistive material (e.g., layer 522, FIG. 5), in an embodiment, and includes an input end 732, an output end 734, and multiple resistive sections 710, 740, 770 between the input and output ends 732, 734. A total length 702 of the multi-section resistor 700 between the input and output ends 732, 734 along a primary axis 704 of the resistor 700 is in a range of about 100 microns to about 1500 microns, in an embodiment, although the total length 702 may be shorter or longer, as well.

According to an embodiment, the multiple resistive sections 710, 740, 770 are integrally formed and connected with each other in series (e.g., first resistive section 710 is directly connected to second resistive section 740, and second resistive section 740 is directly connected to third resistive section 770). When integrated into a transistor circuit (e.g., transistor circuits 120, 220, 400), the input end 732 would be electrically coupled (e.g., through vias, conductive traces, and a series feedback capacitor 134, 434) to a current carrying terminal of the transistor (e.g., to node 142 or contact pad 442, corresponding to the source or drain of transistor 122, 422), and the output end 734 would be electrically coupled (e.g., through vias and conductive traces) to a control terminal of the transistor (e.g., to node 140 or contact pad 440, corresponding to the gate of transistor 122, 422). In other embodiments, the resistive sections 710, 740, 770 (or portions thereof) may be formed using portions of different resistive material layers, and/or the resistive sections 710, 740, 770 may be connected together with intervening conductive structures (e.g., conductive vias and/or traces).

In contrast with the resistor 600 depicted in FIG. 6, the second resistive section 740 of resistor 700 has an irregular shape, which provides an extension to the length of resistive material between the input and output ends 732, 734 of resistor 700 (and thus the resistance value of resistor 700) without increasing the overall length 702 of resistor 700 (as measured parallel to primary axis 704). Essentially, the second resistive section 740 is defined by a width 744, and a distance 742 between first and second ends 746, 748 of the second resistive section 740. The width 744 is measured perpendicular to the primary axis 704 of the resistor 700, and the distance 742 runs parallel with the primary axis 704. According to an embodiment, the distance 742 between the first and second ends 746, 748 of the second resistive section 740 is in a range of about 10 percent to about 50 percent of the entire length 702 of the resistor 700 (e.g., in a range of about 20 microns to about 750 microns), although the distance 742 may be smaller or larger, as well. The width 744 of the second resistive section 740 also may be in a range of about 20 microns to about 750 microns, although the width 744 may be smaller or larger, as well.

According to an embodiment, the second resistive section 740 includes one or more meander sections 750, each of which includes multiple resistive sub-sections that are not substantially parallel with the primary axis 704 of the resistor 700. Although resistor 700 is shown to include only one meander section 750, alternate embodiments of resistor 700 may include multiple meander sections (e.g., multiple instances of meander section 750 coupled together in series).

The length of resistive material between the first and second ends 746, 748 of the second resistive section 740, referred to herein as the "path length" of the second resistive section 740, is defined by the shape, size, and number of meander sections 750. According to an embodiment, the length of resistive material between the first and second ends 746, 748 is significantly greater than the linear distance 742 between the first and second ends 746, 748. In other words, the path length of the second resistive section 740 is significantly greater than the distance 742 between the first and second ends 746, 748 of the second resistive section 740. For example, the path length of the second resistive section 740 may be in a range of about 150 to about 500 percent of the distance 742 between the first and second ends 746, 748. The path length may be shorter or larger than the above given range, as well. Said another way, according to an embodiment, the electrical length between the first and second ends 746, 748 is significantly greater than would be the electrical length of a segment of resistive material extending straight between the first and second ends 746, 748.

In the illustrated embodiment, the meander section 750 has a substantially serpentine shape, which originates and terminates at the primary axis 704. More specifically, going from the first end 746 to the second end 748 of the second resistive section 740, the meander section 750 includes a first resistive sub-section that is substantially orthogonal to and extends away from the primary axis 704, a second resistive sub-section that is substantially parallel to but offset from the primary axis 704, a third resistive sub-section that is substantially orthogonal to and crosses over the primary axis 704, a fourth resistive sub-section that is substantially parallel to but offset from the primary axis 704, and a fifth resistive sub-section that is substantially orthogonal to and returns to the primary axis 704. In an embodiment, transitions between sub-sections are substantially curved (i.e., lacking sharp interior and exterior corners).

The overall path length (and thus the overall resistance value) of the second resistive section 740 is affected by the number of meander sections 750, and the path length (and thus the resistance value) of each meander section is affected by the number of resistive sub-sections, the shapes and orientations (with respect to the primary axis 704) of resistive sub-sections, the lengths of the orthogonal resistive sub-sections (e.g., defining the overall width 744 of the meander section 750), and the lengths of the parallel resistive sub-sections (e.g., defining the spacing between parallel resistive sub-sections). Although a meander section 750 having a particular serpentine shape and number and configuration of sub-sections is illustrated in FIG. 7, alternate embodiments may include one or more meander sections 750 having different shapes, numbers, and configurations of sub-sections from the meander section 750 illustrated in FIG. 7. The primary important feature of each meander section is that the path length provided by the meander section is greater than the linear distance between ends of the meander section.

Similar to the embodiment of FIG. 6, the first resistive section 710 and the third resistive section 770 have lengths 712, 772 that are substantially parallel and co-linear with the primary axis 704 of the resistor 700, where the primary axis 704 may be defined as an axis that extends between the first and second ends 732, 734. In an alternate embodiment, either or both of the first and third resistive sections 710, 770 (or portions thereof) may have lengths that are offset from or not parallel with the primary axis 704.

The length 712 of the first resistive section 710 between first and second ends 714, 716 of the first resistive section 710 is in a range of about 50 microns to about 750 microns, in an embodiment, although the length 712 may be shorter or longer, as well. Similarly, the length 772 of the third resistive section 770 between first and second ends 774, 776 of the third resistive section 770 is in a range of about 50 microns to about 750 microns, in an embodiment, although the length 772 may be shorter or longer, as well.

The general shape of the first resistive section 710 (as viewed from the top) is similar to the general shape of the first resistive section 610 of FIG. 6. More particularly, the shape of the first resistive section 710 is defined by an edge 720 of the first resistive section 710 (coincident with the input end 732 of the resistor 700), and sides 722, 724 of the first resistive section 710, where the sides 722, 724 extend between the first and second ends 714, 716 of the first resistive section 710.

According to an embodiment, the first end 714 of the first resistive section 710 has a first width 726, and the second end 716 of the first resistive section 710 has a second width 728 that is substantially narrower than the first width 726. For example, the second width 728 may be in a range of about 5 percent to about 60 percent of the first width 726, in an embodiment. In an alternate embodiment, the second width 728 may be in a range of about 2 percent to about 80 percent of the first width 726. According to another embodiment, the first width 726 is at least 200 percent greater than the second width 728. According to an embodiment, the first width 726 may be in a range of about 10 to about 500 microns, and the second width 728 may be in a range of about 2 to about 400 microns, in an embodiment. In alternate embodiments, the first and second widths 726, 728 may be shorter or wider than the above-given ranges.

According to an embodiment, the distance between the sides 722, 724 of the first resistive section 710 narrows smoothly along arcs between the first width 726 and the second width 728, as shown in FIG. 7. In alternate embodiments, the distance between the sides 722, 724 may narrow linearly, or the distance between the sides 722, 724 may narrow in increments. In still another alternate embodiment, one of the sides (e.g., side 722) may be substantially straight and parallel with the primary axis 704, while the other side (e.g., side 724) has an arc or other shape that is not parallel with the primary axis 704.

The third resistive section 770 also has a first end 778 and a second end 780. The general shape of the third resistive section 770 (as viewed from the top) is defined by an edge 782 of the third resistive section 770 (coincident with the output end 734 of the resistor 700), and sides 774, 776 of the third resistive section 770, where the sides 774, 776 extend between the first and second ends 778, 780 of the third resistive section 770.

According to an embodiment, the third resistive section 770 may include two sub-sections (not specifically labeled), each similar in configuration to the sub-sections 644, 646 of the second resistive section 640 of resistor 600 (FIG. 6). Along the sub-section connected to the second resistive section 740, the sides 754, 756 of the third resistive section 770 are substantially parallel to each other. Conversely, the sub-section at the output end 734 of resistor 700 has a tapered shape, similar to the tapered shape of the first resistive section 710, although not as extreme. More particularly, according to an embodiment, the first end 778 of the third resistive section 770 has approximately the second width 728, and the second end 780 of the third resistive section 770 has a third width 788 that is wider than the second width 728. According to an embodiment, the third width 788 may be in a range of about 105 percent to about 200 percent of the second width 728, in an embodiment. According to another embodiment, the third width 788 may be in a range of about 200 percent to about 1000 percent of the second width 728. For example, the third width 788 may be at least 5 percent greater than the second width 728, in an embodiment. As another example, the third width 788 may be at least 20 percent greater than the second width 728. For example, the second width 728 may be in a range of about 2 to about 400 microns, and the third width 788 may be in a range of about 2.1 to about 500 microns, in an embodiment. In alternate embodiments, the second and third widths 728, 788 may be shorter or wider than the above-given ranges. Further, in yet another alternate embodiment, the third resistive section 770 may have a substantially straight shape (i.e., not tapered), so that the second width 728 and the third width 788 are substantially equal.

According to an embodiment, the distance (measured in a direction perpendicular to the primary axis 704) between the sides 774, 776 of the second sub-section of the third resistive section 770 widens smoothly along arcs between the second width 728 and the third width 788, as shown in FIG. 7. In alternate embodiment, the distance between the sides 774, 776 may widen linearly, or the distance between the sides 774, 776 may widen in increments. In still another alternate embodiment, one of the sides (e.g., side 774) may be substantially straight and parallel with the primary axis 704, while the other side (e.g., side 776) has an arc or other shape that is not parallel with the primary axis 704.

Although FIG. 7 depicts a "double-tapered" embodiment, an alternate embodiment may exclude the taper proximate to the output end 734 of resistor 700. In other words, a "single-tapered" alternate embodiment of resistor 700 may include a third resistive section 770 defined by sides 774, 776 that are substantially parallel to each other along an entire length 772 of the third resistive section 770. In addition, although particular tapered shapes are depicted in FIG. 7, alternate embodiments may include tapers that are more or less extreme than those depicted in FIG. 7.

As mentioned previously, the tapered resistive features of embodiments of resistors 600, 700 enable the resistors 600, 700 to provide a desired effective feedback resistance while reducing the peak current densities and temperatures experienced by the resistors 600, 700. When utilized as a feedback resistor (e.g., resistor 132, 432, FIGS. 1, 4) in an integrated transistor circuit (e.g., transistor circuits 120, 420), the tapered shape of the resistor 600, 700 (i.e., significantly wider at the input end 632, 732 than the output end 634, 734) may result in a reduction in the peak current density (and thus the peak temperature) of the resistor 600, 700 during operation, especially at the input end 632, 732 of the resistor 600, 700. More particularly, because the excitation voltages are significantly higher at the input end 632, 732 than at the output end 634, 734, the relatively wide width 626, 726 of the resistor 600, 700 at the input end 632, 732 results in the relatively high currents at the input end 632, 732 being distributed over a larger mass of resistive material, thus reducing the peak current density at the input end 632, 732, when compared with conventional feedback resistor structures. Said another way, the widths 626, 658, 726, 748 of the input and output ends 632, 634, 732, 734 are related to the magnitudes of the excitation voltages at the ends 632, 634, 732, 734. By reducing the peak current density, the peak temperature experienced by the resistor 600, 700 also is reduced.

Generally, current densities increase with increasing operational frequencies. Accordingly, the width 626, 726 of the input end 632, 732 of the resistor 600, 700 may be selected based on the intended operational frequencies of the device (e.g., device 200, FIG. 2) within which the resistor 600, 700 is incorporated. More particularly, the width 626, 726 may be selected to be relatively wide for devices operating at relatively high frequencies (e.g., frequencies at 2 gigaHertz (GHz) or more), and may be selected to be relatively narrow for devices operating at relatively low frequencies.

In addition, in the embodiment of resistor 700 depicted in FIG. 7, the path length of the second resistive section 740 easily may be modified without changing the overall length 702 of the resistor 700. Accordingly, the total resistance value of resistor 700 easily may be changed without changing the overall length 702 of the resistor 700. This feature of resistor 700 enables the resistance value easily to be tuned without major re-design of an integrated device within which the resistor 700 is included.

Figure 8:
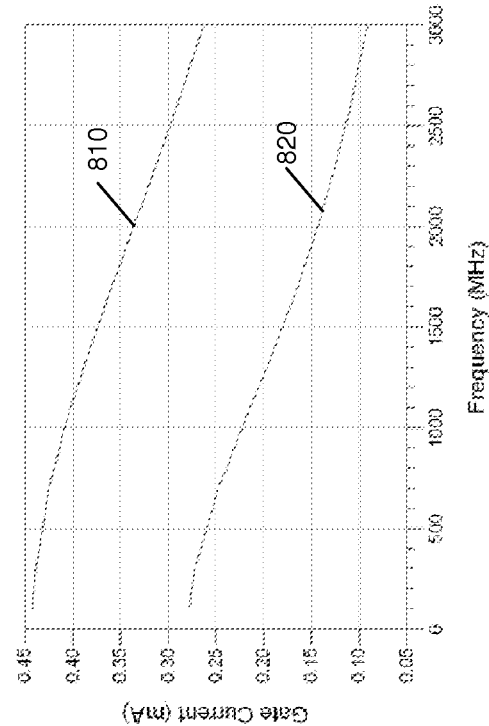
FIG. 8 is a graph that depicts a simulation of the feedback current as seen by a transistor control terminal for embodiments of monolithic transistor circuits that include integrated feedback resistors both without and with a meander section.

FIG. 8 is a graph that depicts a simulation of the feedback current (in milliamps (mA)) as seen by a transistor control terminal (e.g., a gate) for embodiments of monolithic transistor circuits that include integrated feedback resistors both without and with a meander section. More specifically, trace 810 simulates feedback current for an embodiment that includes a feedback resistor without a meander section (e.g., resistor 600), and trace 820 simulates feedback current for an embodiment that includes a feedback resistor with a meander section (e.g., resistor 700). As the graph indicates, the inclusion of a meander section results in a significant reduction in gate current (e.g., about 18 mA) across a wide range of frequencies. If more or less gate current reduction is desired, the design of the meander section and/or the number of meander sections may be adjusted.

Figure 9:
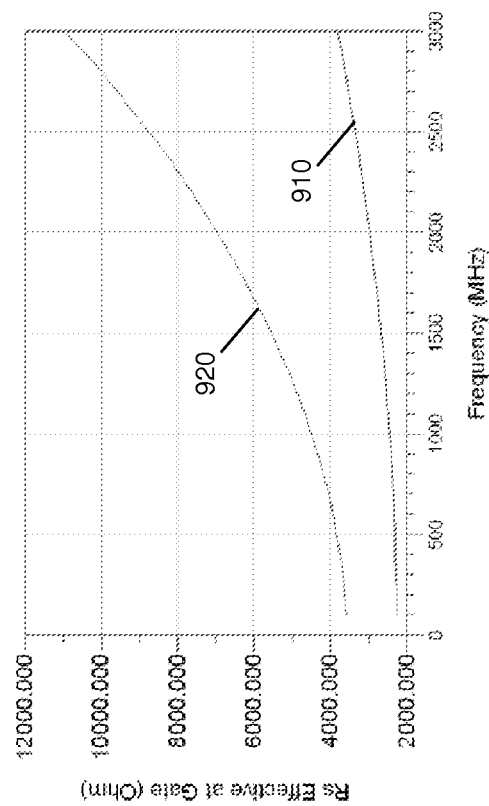
FIG. 9 is a graph that depicts a simulation of the effective feedback resistance as seen by a transistor control terminal for embodiments of monolithic transistor circuits that include integrated feedback resistors both without and with a meander section.

FIG. 9 is a graph that depicts a simulation of the effective feedback resistance, Rs (in Ohms) as seen by a transistor control terminal (e.g., a gate) for embodiments of monolithic transistor circuits that include integrated feedback resistors both without and with a meander section. More specifically, trace 910 simulates effective feedback resistance for an embodiment that includes a feedback resistor without a meander section (e.g., resistor 600), and trace 920 simulates effective feedback resistance for an embodiment that includes a feedback resistor with a meander section (e.g., resistor 700). As the graph indicates, the inclusion of a meander section results in a significant increase in effective feedback resistance (e.g., about 5000 ohms at 2500 megahertz (MHz)) across a wide range of frequencies. If more or less effective resistance increase is desired, the design of the meander section and/or the number of meander sections may be adjusted.

Figure 10:
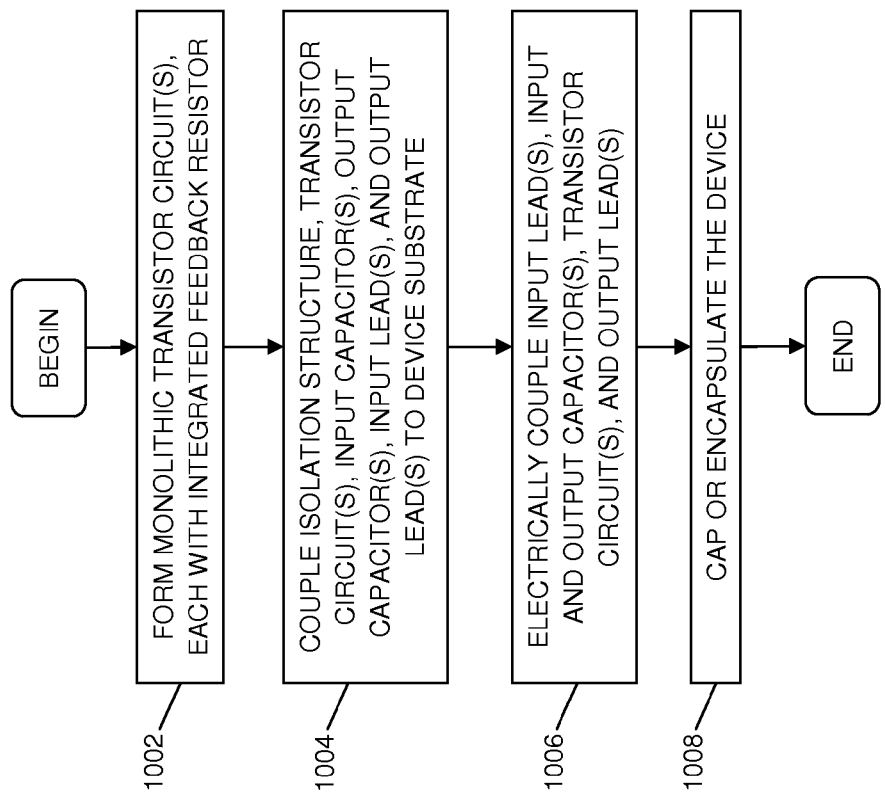
FIG. 10 is a flowchart of a method of manufacturing a packaged RF device with one or more monolithic transistor circuits, in accordance with an example embodiment.

FIG. 10 is a flowchart of a method of manufacturing a packaged RF device (e.g., device 200, FIG. 2) with one or more monolithic transistor circuits (e.g., circuit 220, 400, FIGS. 2, 4), in accordance with an example embodiment. The method may begin, in block 1002, by forming one or more monolithic transistor circuits (e.g., circuit 220, 400), each with one or more feedback circuits. According to an embodiment, and as described in detail previously, each monolithic feedback circuit includes a feedback resistor (e.g., resistor 432, 600, 700) and, in some embodiments, a feedback capacitor (e.g., capacitor 434) coupled in series with the feedback resistor. In alternate embodiments, each feedback circuit may exclude the series capacitor.

As described previously, forming each monolithic transistor circuit includes forming one or more transistors (e.g., transistor 422) in and over a semiconductor substrate (e.g., substrate 510), where each transistor has first and second current carrying terminals (e.g., a source and drain), variable-conductivity channel between the first and second current carrying terminals, and a control terminal (e.g., a gate). The transistor(s) may be formed using conventional semiconductor manufacturing techniques.

Forming the monolithic transistor circuit further includes forming one or more resistors (e.g., resistor 432, 600, 700) over the top surface of the semiconductor substrate, by forming a patterned layer of resistive material (e.g., layer 522, which may include polysilicon, tungsten silicide, or another resistive material). The patterned layer of resistive material may be formed using conventional semiconductor manufacturing techniques. As discussed previously, embodiments of the resistor include an input end, an output end, a first tapered resistive section at the input end (e.g., section 610, 710), and a second resistive section at the output end (e.g., section 640, 670), which also may be tapered. Some embodiments also include a third resistive section (e.g., section 740) coupled in series between the first and second resistive sections. The third resistive section includes one or more meander sections (e.g., meander section 750), which increase the path length (and thus the electrical length) of the resistor, without increasing the overall length of the resistor.

Forming the monolithic transistor circuit further includes forming and patterning additional conductive and insulating layers (e.g., layers 516, 518, 520, 524, 526) over the semiconductor substrate. During this process, an integrated series capacitor (e.g., capacitor 434) also may be formed from portions of the conductive and insulating layers, and electrically connected in series with an end (e.g., the input end 532) of the integrated resistor (e.g., resistor 432). The electrical interconnection may be made using various conductive vias and portions of conductive layers. In addition, portions of the top conductive layer (e.g., layer 526) may be patterned and interconnected with the integrated capacitor and resistor to provide bondpads (e.g., bondpads 440, 442) at either end of the feedback circuit. The bondpads also are electrically coupled with the control terminal of the transistor and one of the current carrying terminals of the transistor, as discussed previously. Accordingly, the monolithic transistor circuit is formed so that the one or more feedback circuits are coupled across a current carrying terminal and the control terminal.

More specifically, the input end of the resistor is electrically coupled to the current carrying terminal (e.g., through a series capacitor), and the output end of the resistor is electrically coupled to the control terminal of the transistor. The additional layers, the capacitors, and the conductive interconnects and pads may be formed using conventional semiconductor manufacturing techniques.

In block 1004, for an air cavity embodiment, an isolation structure (e.g., isolation structure 208, FIG. 2) is coupled to a device substrate (e.g., flange 206). In addition, the one or more monolithic transistor circuits (e.g., transistor circuit 220, 400), input impedance matching circuit elements (e.g., capacitors 214), and output impedance matching circuit elements (e.g., capacitors 242) are coupled to a portion of the top surface of the substrate that is exposed through an opening in the isolation structure (e.g., the active device area). Leads (e.g., input and output leads 202, 204, and bias leads) are coupled to the top surface of the isolation structure (e.g., to metallization on the top surface of the isolation structure). In an alternate embodiment, a conductive layer on the top surface of the isolation structure may be patterned and etched to form a leadframe (e.g., prior to coupling the isolation structure to the flange). For overmolded (e.g., encapsulated) device embodiments, the isolation structure may be excluded, and the substrate and leads may form portions of a leadframe.

In block 1006, the input lead(s), input capacitor(s), transistor circuit(s), output capacitor(s), and output lead(s) are electrically coupled together. For example, the electrical connections may be made using bondwires between the various device components and elements, as discussed previously. Finally, in block 1008, the device is capped (e.g., with cap 310) or encapsulated (e.g., with mold compound, not illustrated). The device may then be incorporated into a larger electrical system.

An embodiment of an integrated resistor includes a semiconductor substrate, and a resistor formed over the top surface of the semiconductor substrate from resistive material. The resistor includes input and output ends, and first and second resistive sections. The first resistive section has a first length defined between a first end of the first resistive section and a second end of the first resistive section. The first end of the first resistive section corresponds to the input end of the resistor, and the first end of the first resistive section has a first width. The second end of the first resistive section has a second width in a range of 5 percent to 60 percent of the first width. The second resistive section is coupled in series with the first resistive section, and has a second length defined between a first end of the second resistive section and a second end of the second resistive section. The first end of the second resistive section is coupled to the second end of the first resistive section, and the second end of the second resistive section corresponds to the output end of the resistor.

Another embodiment of an integrated resistor includes a semiconductor substrate having a top surface and a resistor formed over the top surface of the semiconductor substrate from one or more portions of one or more layers of resistive material. The resistor includes an input end, an output end, a first resistive section, and a second resistive section. The first resistive section has a first length defined between a first end of the first resistive section and a second end of the first resistive section. The first end of the first resistive section corresponds to the input end of the resistor, and the first end of the first resistive section has a first width. The second end of the first resistive section has a second width in a range of 2 percent to 80 percent of the first width. The second resistive section is coupled in series with the first resistive section. The second resistive section has a second length defined between a first end of the second resistive section and a second end of the second resistive section. The first end of the second resistive section is coupled to the second end of the first resistive section, and the second end of the second resistive section corresponds to the output end of the resistor. The second end of the second resistive section has a third width that is at least 5 percent greater than the second width.

Another embodiment of an integrated resistor includes a semiconductor substrate having a top surface and a resistor formed over the top surface of the semiconductor substrate from one or more portions of one or more layers of resistive material. The resistor includes an input end, an output end, a first resistive section, a second resistive section, and a third resistive section. The first resistive section has a first length defined between a first end of the first resistive section and a second end of the first resistive section. The first end of the first resistive section corresponds to the input end of the resistor, and the first end of the first resistive section has a first width. The second end of the first resistive section has a second width in a range of 2 percent to 80 percent of the first width. The second resistive section is coupled in series with the first resistive section. The second resistive section has a second length defined between a first end of the second resistive section and a second end of the second resistive section. The first end of the second resistive section is coupled to the second end of the first resistive section, and the second end of the second resistive section corresponds to the output end of the resistor. The third resistive section is coupled in series between the first resistive section and the second resistive section. The third resistive section is defined by a first distance between a first end of the third resistive section and a second end of the third resistive section. The first distance runs parallel with the primary axis of the resistor. The third resistive section includes one or more meander sections, where each meander section includes one or more resistive sub-sections that are not substantially parallel with the primary axis of the resistor, and a path length of resistive material forming the third resistive section is greater than the first distance.

An embodiment of a monolithic transistor circuit includes a semiconductor substrate, a transistor, and a feedback circuit. The transistor is formed in and over the semiconductor substrate, and the transistor includes a first current carrying terminal, a second current carrying terminal, a variable-conductivity channel between the first and second current carrying terminals, and a control terminal. The feedback circuit is coupled between the first current carrying terminal and the control terminal. The feedback circuit includes an integrated feedback resistor formed over the top surface of the semiconductor substrate from one or more portions of one or more layers of resistive material. The integrated feedback resistor includes an input end coupled to the first current carrying terminal, an output end coupled to the control terminal, and first and second resistive sections. The first resistive section has a first length defined between a first end of the first resistive section and a second end of the first resistive section. The first end of the first resistive section corresponds to the input end of the resistor, and the first end of the first resistive section has a first width. The second end of the first resistive section has a second width in a range of 5 percent to 60 percent of the first width. The second resistive section is coupled in series with the first resistive section, and has a second length defined between a first end of the second resistive section and a second end of the second resistive section. The first end of the second resistive section is coupled to the second end of the first resistive section, and the second end of the second resistive section corresponds to the output end of the resistor.

An embodiment of a packaged RF amplifier device includes a device substrate, an input lead coupled to the device substrate, an output lead coupled to the device substrate, and a monolithic transistor circuit. The monolithic transistor circuit includes a semiconductor substrate, a transistor, and a feedback circuit. The transistor is formed in and over the semiconductor substrate, and the transistor includes a first current carrying terminal, a second current carrying terminal, a variable-conductivity channel between the first and second current carrying terminals, and a control terminal. The feedback circuit is coupled between the first current carrying terminal and the control terminal. The feedback circuit includes an integrated feedback resistor formed over the top surface of the semiconductor substrate from one or more portions of one or more layers of resistive material. The integrated feedback resistor includes an input end coupled to the first current carrying terminal, an output end coupled to the control terminal, and first and second resistive sections. The first resistive section has a first length defined between a first end of the first resistive section and a second end of the first resistive section. The first end of the first resistive section corresponds to the input end of the resistor, and the first end of the first resistive section has a first width. The second end of the first resistive section has a second width in a range of 5 percent to 60 percent of the first width. The second resistive section is coupled in series with the first resistive section, and has a second length defined between a first end of the second resistive section and a second end of the second resistive section. The first end of the second resistive section is coupled to the second end of the first resistive section, and the second end of the second resistive section corresponds to the output end of the resistor.

An embodiment of a method of manufacturing a device that includes an integrated resistor includes forming a resistor over the top surface of a semiconductor substrate from one or more portions of one or more layers of resistive material. The resistor includes input and output ends, and first and second resistive sections. The first resistive section has a first length defined between a first end of the first resistive section and a second end of the first resistive section. The first end of the first resistive section corresponds to the input end of the resistor, and the first end of the first resistive section has a first width. The second end of the first resistive section has a second width in a range of 5 percent to 60 percent of the first width. The second resistive section is coupled in series with the first resistive section, and has a second length defined between a first end of the second resistive section and a second end of the second resistive section. The first end of the second resistive section is coupled to the second end of the first resistive section, and the second end of the second resistive section corresponds to the output end of the resistor.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated resistor comprising:
   a semiconductor substrate having a top surface; and
   a resistor formed over the top surface of the semiconductor substrate from one or more portions of one or more layers of resistive material, wherein the resistor includes
   an input end,
   an output end,
   a first resistive section having a first length defined between a first end of the first resistive section and a second end of the first resistive section, wherein the first end of the first resistive section corresponds to the input end of the resistor, and the first end of the first resistive section has a first width, and wherein the second end of the first resistive section has a second width in a range of 5 percent to 60 percent of the first width, and
   a second resistive section coupled in series with the first resistive section, wherein the second resistive section has a second length defined between a first end of the second resistive section and a second end of the second resistive section, wherein the first end of the second resistive section is coupled to the second end of the first resistive section, wherein the second resistive section has a third width at the first end of the second resistive section, and a fourth width at the second end of the second resistive section, wherein the fourth width is at least 5 percent greater than the third width, and wherein the second end of the second resistive section corresponds to the output end of the resistor.

2. The integrated resistor of claim 1, wherein a distance between sides of the first resistive section narrows along arcs between the first width and the second width.

3. The integrated resistor of claim 1, wherein the first end of the second resistive section is directly connected to the second end of the first resistive section.

4. The integrated resistor of claim 1, wherein the first end of the second resistive section is connected to the second end of the first resistive section through one or more intervening conductive structures.

5. An integrated resistor comprising:
a semiconductor substrate having a top surface; and
a resistor formed over the top surface of the semiconductor substrate from one or more portions of one or more layers of resistive material, wherein the resistor includes
an input end,
an output end,
a first resistive section having a first length defined between a first end of the first resistive section and a second end of the first resistive section, wherein the first end of the first resistive section corresponds to the input end of the resistor, and the first end of the first resistive section has a first width, and wherein the second end of the first resistive section has a second width in a range of 5 percent to 60 percent of the first width,
a second resistive section coupled in series with the first resistive section, wherein the second resistive section has a second length defined between a first end of the second resistive section and a second end of the second resistive section, wherein the first and second lengths are substantially parallel with a primary axis of the resistor, wherein the first end of the second resistive section is coupled to the second end of the first resistive section, and the second end of the second resistive section corresponds to the output end of the resistor, and
a third resistive section coupled in series between the first resistive section and the second resistive section, wherein the third resistive section is defined by a first distance between a first end of the third resistive section and a second end of the third resistive section, wherein the first distance runs parallel with the primary axis of the resistor, and wherein the third resistive section includes one or more meander sections, wherein each meander section includes one or more resistive subsections that are not substantially parallel with the primary axis of the resistor, and a path length of resistive material forming the third resistive section is greater than the first distance.

6. The integrated resistor of claim 1, wherein a distance between sides of the second resistive section widens along arcs between the third width and the fourth width.

7. The integrated resistor of claim 5, wherein the second resistive section has a third width at the first end of the second resistive section, and a fourth width at the second end of the second resistive section, wherein the fourth width is substantially equal to the third width.

8. The integrated resistor of claim 5, wherein each meander section has a serpentine shape.

9. The integrated resistor of claim 5, wherein the path length is in a range of 150 percent to 500 percent of the first distance.

10. An integrated resistor comprising:
a semiconductor substrate having a top surface; and
a resistor formed over the top surface of the semiconductor substrate from one or more portions of one or more layers of resistive material, wherein the resistor includes
an input end,
an output end,
a first resistive section having a first length defined between a first end of the first resistive section and a second end of the first resistive section, wherein the first end of the first resistive section corresponds to the input end of the resistor, and the first end of the first resistive section has a first width, and wherein the second end of the first resistive section has a second width in a range of 2 percent to 80 percent of the first width, and
a second resistive section coupled in series with the first resistive section, wherein the second resistive section has a second length defined between a first end of the second resistive section and a second end of the second resistive section, wherein the first end of the second resistive section is coupled to the second end of the first resistive section, the second end of the second resistive section corresponds to the output end of the resistor, and wherein the second end of the second resistive section has a third width that is at least 5 percent greater than the second width.

11. The integrated resistor of claim 10, wherein the first and second lengths are substantially parallel with a primary axis of the resistor, and wherein the resistor further comprises:
a third resistive section coupled in series between the first resistive section and the second resistive section, wherein the third resistive section is defined by a first distance between a first end of the third resistive section and a second end of the third resistive section, wherein the first distance runs parallel with the primary axis of the resistor, and wherein the third resistive section includes one or more meander sections, wherein each meander section includes one or more resistive subsections that are not substantially parallel with the primary axis of the resistor, and a path length of resistive material forming the third resistive section is greater than the first distance.

12. An integrated resistor comprising:
a semiconductor substrate having a top surface; and
a resistor formed over the top surface of the semiconductor substrate from one or more portions of one or more layers of resistive material, wherein the resistor includes
an input end,
an output end,
a first resistive section having a first length defined between a first end of the first resistive section and a second end of the first resistive section, wherein the first end of the first resistive section corresponds to the input end of the resistor, and the first end of the first resistive section has a first width, and wherein the second end of the first resistive section has a second width in a range of 2 percent to 80 percent of the first width,
a second resistive section coupled in series with the first resistive section, wherein the second resistive section has a second length defined between a first end of the second resistive section and a second end of the second resistive section, wherein the first end of the second resistive section is coupled to the second end of the first resistive section, and the second end of the second resistive section corresponds to the output end of the resistor, wherein the first and second lengths are substantially parallel with a primary axis of the resistor; and a third resistive section coupled in series between the first resistive section and the second resistive section, wherein the third resistive section is defined by a first distance between a first end of the third resistive section and a second end of the third resistive section, wherein the first distance runs parallel with the primary axis of the resistor, and wherein the third resistive section includes one or more meander sections, wherein each meander section includes one or more resistive sub-sections that are not substantially parallel with the primary axis of the resistor, and a path length of resistive material forming the third resistive section is greater than the first distance.

13. The integrated resistor of claim 12, wherein the second resistive section has a third width at the first end of the second resistive section, and a fourth width at the second end of the second resistive section, wherein the fourth width is at least 5 percent greater than the third width.

14. A monolithic transistor circuit comprising:
a semiconductor substrate;
a transistor formed in and over the semiconductor substrate, wherein the transistor includes a first current carrying terminal, a second current carrying terminal, a variable-conductivity channel between the first and second current carrying terminals, and a control terminal; and
a feedback circuit coupled between the first current carrying terminal and the control terminal, wherein the feedback circuit includes
an integrated feedback resistor formed over the top surface of the semiconductor substrate from one or more portions of one or more layers of resistive material, wherein the integrated feedback resistor includes
an input end coupled to the first current carrying terminal,
an output end coupled to the control terminal,
a first resistive section having a first length defined between a first end of the first resistive section and a second end of the first resistive section, wherein the first end of the first resistive section corresponds to the input end of the integrated feedback resistor, and the first end of the first resistive section has a first width, and wherein the second end of the first resistive section has a second width in a range of 5 percent to 60 percent of the first width, and
a second resistive section coupled in series with the first resistive section, wherein the second resistive section has a second length defined between a first end of the second resistive section and a second end of the second resistive section, wherein the first end of the second resistive section is coupled to the second end of the first resistive section, and the second end of the second resistive section corresponds to the output end of the integrated feedback resistor, and
wherein the control terminal is coupled to a first conductive pad proximate to a top surface of the monolithic transistor circuit, the first current carrying terminal is coupled to a second conductive pad proximate to the top surface of the monolithic transistor circuit, and a total distance between the input and output ends of the integrated feedback resistor is less than or equal to a distance between the first and second conductive pads.

15. The monolithic transistor circuit of claim 14, wherein the feedback circuit further comprises:
a capacitor coupled in series with the integrated feedback resistor.

16. The monolithic transistor circuit of claim 14, wherein the one or more layers of resistive material are selected from polysilicon, tungsten silicide, and another material having a sheet resistivity in a range of 1.0 to 100 Ohms per square.

17. The monolithic transistor circuit of claim 14, wherein the first end of the second resistive section is directly connected to the second end of the first resistive section.

18. A monolithic transistor circuit comprising:
a semiconductor substrate;
a transistor formed in and over the semiconductor substrate, wherein the transistor includes a first current carrying terminal, a second current carrying terminal, a variable-conductivity channel between the first and second current carrying terminals, and a control terminal; and
a feedback circuit coupled between the first current carrying terminal and the control terminal, wherein the feedback circuit includes
an integrated feedback resistor formed over the top surface of the semiconductor substrate from one or more portions of one or more layers of resistive material, wherein the integrated feedback resistor includes
an input end coupled to the first current carrying terminal,
an output end coupled to the control terminal,
a first resistive section having a first length defined between a first end of the first resistive section and a second end of the first resistive section, wherein the first end of the first resistive section corresponds to the input end of the integrated feedback resistor, and the first end of the first resistive section has a first width, and wherein the second end of the first resistive section has a second width in a range of 5 percent to 60 percent of the first width, and
a second resistive section coupled in series with the first resistive section, wherein the second resistive section has a second length defined between a first end of the second resistive section and a second end of the second resistive section, wherein the first end of the second resistive section is coupled to the second end of the first resistive section, and the second end of the second resistive section corresponds to the output end of the integrated feedback resistor, and wherein the first end of the second resistive section is connected to the second end of the first resistive section through one or more intervening conductive structures.

19. A monolithic transistor circuit comprising:
a semiconductor substrate;
a transistor formed in and over the semiconductor substrate, wherein the transistor includes a first current carrying terminal, a second current carrying terminal, a variable-conductivity channel between the first and second current carrying terminals, and a control terminal; and
a feedback circuit coupled between the first current carrying terminal and the control terminal, wherein the feedback circuit includes
an integrated feedback resistor formed over the top surface of the semiconductor substrate from one or more portions of one or more layers of resistive material, wherein the integrated feedback resistor includes
an input end coupled to the first current carrying terminal,
an output end coupled to the control terminal,
a first resistive section having a first length defined between a first end of the first resistive section and a second end of the first resistive section, wherein the first end of the first resistive section corresponds to the input end of the integrated feedback resistor, and the first end of the first resistive section has a first width, and wherein the second end of the first resistive section has a second width in a range of 5 percent to 60 percent of the first width, a second resistive section coupled in series with the first resistive section, wherein the second resistive section has a second length defined between a first end of the second resistive section and a second end of the second resistive section, wherein the first end of the second resistive section is coupled to the second end of the first resistive section, and the second end of the second resistive section corresponds to the output end of the integrated feedback resistor, and wherein the first and second lengths are substantially parallel with a primary axis of the integrated feedback resistor, and a third resistive section coupled in series between the first resistive section and the second resistive section, wherein the third resistive section is defined by a first distance between a first end of the third resistive section and a second end of the third resistive section, wherein the first distance runs parallel with the primary axis of the integrated feedback resistor, and wherein the third resistive section includes one or more meander sections, wherein each meander section includes one or more resistive sub-sections that are not substantially parallel with the primary axis of the integrated feedback resistor, and a path length of resistive material forming the third resistive section is greater than the first distance.

20. A packaged radio frequency (RF) amplifier device comprising:

a device substrate;

an input lead coupled to the device substrate;

an output lead coupled to the device substrate; and a monolithic transistor circuit that includes a semiconductor substrate, a transistor formed in and over the semiconductor substrate, wherein the transistor includes a control terminal coupled to the input lead, a first current carrying terminal coupled to the output lead, a second current carrying terminal coupled to the device substrate, and a variable-conductivity channel between the first and second current carrying terminals, and a feedback circuit coupled between the first current carrying terminal and the control terminal, wherein the feedback circuit includes an integrated feedback resistor formed over the top surface of the semiconductor substrate from one or more portions of one or more layers of resistive material, wherein the integrated feedback resistor includes an input end coupled to the first current carrying terminal, an output end coupled to the control terminal, a first resistive section having a first length defined between a first end of the first resistive section and a second end of the first resistive section, wherein the first end of the first resistive section corresponds to the input end of the integrated feedback resistor, and the first end of the first resistive section has a first width, and wherein the second end of the first resistive section has a second width in a range of 5 percent to 60 percent of the first width, and a second resistive section coupled in series with the first resistive section, wherein the second resistive section has a second length defined between a first end of the second resistive section and a second end of the second resistive section, wherein the first end of the second resistive section is coupled to the second end of the first resistive section, and the second end of the second resistive section corresponds to the output end of the integrated feedback resistor, and wherein the control terminal is coupled to a first conductive pad proximate to a top surface of the semiconductor substrate, the first current carrying terminal is coupled to a second conductive pad proximate to the top surface of the semiconductor substrate, and a total distance between the input and output ends of the feedback resistor is less than or equal to a distance between the first and second conductive pads.

21. The packaged RF amplifier device of claim 20, further comprising:

an input impedance matching circuit coupled to the device substrate between the input lead and the control terminal; and an output impedance matching circuit coupled to the device substrate between the first current carrying terminal and the output lead.

22. The packaged RF amplifier device of claim 20, wherein the first end of the second resistive section is directly connected to the second end of the first resistive section.

23. The packaged RF amplifier device of claim 20, wherein the first end of the second resistive section is connected to the second end of the first resistive section through one or more intervening conductive structures.

24. The packaged RF amplifier device of claim 20, wherein the first and second lengths are substantially parallel with a primary axis of the integrated feedback resistor, and wherein the integrated feedback resistor further comprises:

a third resistive section coupled in series between the first resistive section and the second resistive section, wherein the third resistive section is defined by a first distance between a first end of the third resistive section and a second end of the third resistive section, wherein the first distance runs parallel with the primary axis of the integrated feedback resistor, and wherein the third resistive section includes one or more meander sections, wherein each meander section includes one or more resistive sub-sections that are not substantially parallel with the primary axis of the integrated feedback resistor, and a path length of resistive material forming the third resistive section is greater than the first distance.

25. A method of manufacturing a device that includes an integrated resistor, the method comprising:

forming a transistor in and over a semiconductor substrate, wherein the transistor includes a first current carrying terminal, a second current carrying terminal, a variable-conductivity channel between the first and second current carrying terminals, and a control terminal;

forming a resistor over the top surface of the semiconductor substrate from one or more portions of one or more layers of resistive material, wherein the resistor includes an input end, an output end, a first resistive section having a first length defined between a first end of the first resistive section and a second end of the first resistive section, wherein the first end of the first resistive section corresponds to the input end of the resistor, and the first end of the first resistive section has a first width, and wherein the second end of the first resistive section has a second width in a range of 5 percent to 60 percent of the first width, and a second resistive section coupled in series with the first resistive section, wherein the second resistive section has a second length defined between a first end of the second resistive section and a second end of the second resistive section, wherein the first end of the second resistive section is coupled to the second end of the first resistive section, and the second end of the second resistive section corresponds to the output end of the resistor;

electrically coupling the input end of the resistor to the first current carrying terminal;

electrically coupling the output end of the resistor to the control terminal;

forming first and second conductive pads proximate to a top surface of the semiconductor substrate, wherein a total distance between the input and output ends of the feedback resistor is less than or equal to a distance between the first and second conductive pads;

electrically coupling the control terminal to the first conductive pad; and electrically coupling the first current carrying terminal to the second conductive pad.

26. The method of claim 25, further comprising:

forming an integrated capacitor over the semiconductor substrate; and electrically coupling the integrated capacitor in series with the resistor between the first current carrying terminal and the control terminal.

27. The method of claim 25, further comprising:

coupling an input lead and an output lead to a device substrate;

attaching the semiconductor substrate to a top surface of the device substrate;

electrically coupling the input lead to the control terminal of the transistor; and electrically coupling the first current carrying terminal to the output lead.

28. The method of claim 27, further comprising:

attaching one or more isolation structures to the top surface of the device substrate, wherein the input lead is attached to a first portion of the isolation structure, and the output lead is attached to a second portion of the isolation structure; and attaching a lid over portions of the input lead, the output lead, the isolation structure, and the semiconductor substrate to form an air cavity device package.

29. The method of claim 27, further comprising:

covering portions of the input lead, the output lead, and the semiconductor substrate with molding compound to form an overmolded device package.

* * * * *